(12) United States Patent
Schlechtriemen et al.

(10) Patent No.: US 8,354,851 B2
(45) Date of Patent: Jan. 15, 2013

(54) PRODUCTION METHOD FOR A CAPACITIVE SENSOR UNIT

(75) Inventors: Martin Schlechtriemen, Staffelbach (DE); Holger Wuerstlein, Zeil am Main (DE); Thomas Weingaertner, Memmelsdorf (DE); Rolf Sitzler, Erlangen (DE)

(73) Assignee: Brose Fahrzeugteile GmbH & Co. Kommanditgesellschaft, Hallstadt, Hallstadt (DE)

( * ) Notice: Subject to any disclaimer, the term of this patent is extended or adjusted under 35 U.S.C. 154(b) by 382 days.

(21) Appl. No.: 12/829,232

(22) Filed: Jul. 1, 2010

(65) Prior Publication Data
US 2011/0001496 A1   Jan. 6, 2011

(30) Foreign Application Priority Data
Jul. 1, 2009   (DE) .................... 20 2009 009 028 U

(51) Int. Cl.
*G01R 27/26* (2006.01)
(52) U.S. Cl. ........ 324/686; 361/278; 361/302; 200/86 A
(58) Field of Classification Search .................. 324/686
See application file for complete search history.

(56) References Cited

U.S. PATENT DOCUMENTS

| | | | | |
|---|---|---|---|---|
| 4,839,480 A * | 6/1989 | Bickley | .................. | 200/86 A |
| 6,946,853 B2 * | 9/2005 | Gifford et al. | ................ | 324/686 |
| 2002/0163770 A1 * | 11/2002 | Shiue et al. | .................... | 361/502 |
| 2003/0071640 A1 * | 4/2003 | Haag et al. | ..................... | 324/674 |
| 2003/0081369 A1 * | 5/2003 | Haag et al. | ..................... | 361/302 |
| 2003/0102966 A1 * | 6/2003 | Konchin et al. | ................. | 340/445 |
| 2003/0122556 A1 * | 7/2003 | Sueyoshi et al. | .............. | 324/686 |
| 2003/0233790 A1 * | 12/2003 | Nuber | ................. | 49/28 |
| 2004/0018425 A1 * | 1/2004 | Kejha et al. | .................... | 429/176 |
| 2004/0145378 A1 * | 7/2004 | Shoji et al. | ..................... | 324/663 |
| 2005/0083039 A1 * | 4/2005 | Kullmann et al. | ........ | 324/207.13 |
| 2005/0179415 A1 * | 8/2005 | Nakano et al. | ................. | 318/478 |
| 2006/0250142 A1 * | 11/2006 | Abe | .............................. | 324/663 |
| 2009/0136716 A1 * | 5/2009 | Scherraus et al. | ........... | 428/156 |
| 2010/0288208 A1 * | 11/2010 | Mottram et al. | .............. | 119/859 |

FOREIGN PATENT DOCUMENTS

| | | |
|---|---|---|
| DE | 102 20 187 B4 | 11/2005 |
| DE | 10 2004 055 476 B3 | 6/2006 |
| DE | 10 2007 050 352 A1 | 4/2009 |
| DE | 103 33 136 B4 | 7/2009 |
| DE | 10 2008 010 547 B3 | 8/2009 |
| EP | 1 154 110 B1 | 11/2005 |

* cited by examiner

*Primary Examiner* — Timothy J Dole
*Assistant Examiner* — Benjamin M Baldridge
(74) *Attorney, Agent, or Firm* — Muncy, Geissler, Olds & Lowe, PLLC

(57) ABSTRACT

An apparatus and production method for a watertight capacitive sensor unit is provided. Accordingly, a carrier, approximately U-shaped in cross section, is made from a water-impermeable material. At least one electrode strip is placed in an interior space of the carrier along the longitudinal extension of the carrier. The interior space is filled with a hardening filler material in such a way that the electrode strip is sealed outwardly watertight.

12 Claims, 1 Drawing Sheet

PRODUCTION METHOD FOR A CAPACITIVE SENSOR UNIT

This nonprovisional application claims priority under 35 U.S.C. §119(a) to German Patent Application No. DE 20 2009 009 028.0, which was filed in Germany on Jul. 1, 2009, and which is herein incorporated by reference.

BACKGROUND OF THE INVENTION

1. Field of the Invention

The invention relates to a production method for a capacitive sensor unit, particularly for use for an anti-pinch device in a motor vehicle. The invention relates further to a sensor unit of this type.

2. Description of the Background Art

In a modern motor vehicle, windows, doors, and other movable parts are often driven by a motor-driven operating device. To prevent an object, particularly a body part of a vehicle passenger, being pinched between the movable part and a rigid car body part during an actuation, this type of operating device is usually assigned an anti-pinch device, which stops or reverses the actuation when a case of pinching is detected.

Anti-pinch devices often comprise a sensor, which detects where applicable the presence of an object in a critical pinch region in the path of travel of the structural part, to stop the actuation as early as possible before the object is in fact pinched. To detect objects in the pinch region without contact, capacitive sensors are used for this purpose. A capacitive sensor of this type comprises one or more electrodes with which an electric field is generated in the pinch region. To detect a case of pinching, the electrical capacitance is measured and evaluated, which is formed between—possibly several—sensor electrodes and/or between a sensor electrode and the vehicle body acting as ground. In so doing, the effect is utilized that a foreign object intruding into the pinch region, particularly a human body part, changes the electric field and thereby the measured capacitance.

In the case of windows, doors, and similar structural parts in the motor vehicle field, it is advantageous to place the sensor in the immediate vicinity of a closing edge of the structural part or of an opposite closing edge of the vehicle body, which, of course, is directly adjacent to the pinch region. This type of closing edge often has a complex geometric, usually three-dimensional meandering form of in some cases considerable length, particularly in large structural parts such as a trunk lid or a convertible top. The closing edge, moreover, is exposed to unfavorable environmental influences such as water and—in some cases chemically aggressive—dirt.

Capacitive sensors suitable for this intended use therefore must, on the one hand, be producible simply in the case of relatively large dimensioning. The electrode(s) of such sensors, on the other hand, must be reliably protected from water and dirt and be resistant to mechanical stress, to assure sufficient failure safety and lifetime.

In a design known, e.g., from German Pat. No. DE 10 2004 055 476 B3, a sensor unit is produced by coextrusion of the electrodes in a flexible tubular hollow form, particularly a rubber seal. In this design, the electrodes are protected by the hollow form in a watertight manner. As a disadvantage, however, only relatively simple electrode structures can be realized by coextrusion at reasonable cost. It is costly in particular to place a number (particularly more than just two) electrode layers, arranged side-by-side in the longitudinal direction of the carrier and insulated from one another, in the hollow body.

SUMMARY OF THE INVENTION

It is therefore an object of the present invention to provide a capacitive sensor unit, especially suitable compared with the above-described background, and a method for the production thereof which is simple to carry out.

Accordingly, an elongated carrier, approximately U-shaped in cross section, is made from a water-impermeable material.

"U-shaped" in cross section in this case generally describes a longish object, which has a bottom at least over a substantial part of its longitudinal extension and two side walls curved away from said bottom on the same side, so that an interior space, which is open to the side opposite to the bottom, is formed between the bottom and these side walls. The bottom in this regard can merge substantially sharp-edged or rounded off into the adjacent side walls. The bottom and the side walls can each be formed flat or arcuate in cross section. In a conceivable embodiment, the carrier can also have a cross section that has the shape of a curve segment, particularly the shape of a circular arc segment, however, in which the bottom and side walls merge continuously into one another. Within the scope of the invention, the carrier can be formed either open or closed at each of its two longitudinal ends. The carrier, in other words, is optionally formed as a channel-shaped or trough-shaped structure or a structure with one open side.

At least one electrode strip can be placed in the interior space of the carrier through the side opening along the longitudinal extension thereof. Next, the interior space, at least in part, is filled with a hardening filler material, so that the electrode strip is enclosed watertight between the carrier and the filler material (hardened in the final production state).

A hardening filler material can be generally understood to be a material that is liquid, especially viscous, in the unprocessed state, and which solidifies during the hardening process into a cohesive but preferably still flexible body. The filler material is in particular a closed-pore foam, an adhesive, or a casting resin, particularly a polyurethane casting resin.

Because the carrier and electrode strip are initially fabricated independently as separate structural parts, these parts can be prefabricated in a simple way in complex geometric forms. In addition, the fabrication of the electrode strip separate from the carrier substantially facilitates the realization of multilayer electrode systems. Overall, therefore, the sensor unit with respect to its geometric form and its electrode structure can be matched especially flexibly to various installation situations, e.g., to the individual shape of a closing edge to be monitored. The interior space of the carrier, open on the long side, permits a simple, especially also a simple automatable placement, especially insertion of the prefabricated electrode strip. Both a mechanical fixation of the electrode strip by the filler material on the carrier and a hermetic encapsulation of the electrode strip from water and dirt are achieved in a simple and effective manner by the embedding of the electrode strip, placed in the carrier, by the filler material.

In addition, the production method of the invention creates the possibility, on the one hand, to contact the electrode strip with electric connecting lines even before the embedding, so that—frequently especially corrosion-susceptible—connecting regions as well can be encapsulated impervious to water and dirt without additional fabrication costs. In addition, optionally other structural components, such as, for example, an electronic sensor control and/or evaluation unit, can be integrated into the above-described sensor unit and thus also encapsulated.

The sensor unit fabricated according to the above-described method can be used for an anti-pinch device, particularly in a motor vehicle. The sensor unit produced according to the invention, however, is not limited to this application.

In an embodiment of the production method, both the carrier and the electrode strip, as well as the filler material, are each made of a material that is flexible, i.e., bendable, in the final fabrication state of the sensor unit. By this means, it is possible advantageously to bend the fabricated finished sensor unit into a shape according to a predefined installation situation. In an advantageous process variant, by which a sensor unit can be produced in a simplified manner, which in its final mounting position (e.g., along the closing edge of a vehicle trunk lid) runs according to its intended purpose along a three-dimensional curved space curve, the sensor unit is first fabricated in a merely two-dimensional curved form. The carrier is accordingly first produced substantially in the form of a curved path lying in a (flat) plane. The dimensions and shape of this path are matched especially, for instance, to a contour, projected onto this plane, of the three-dimensional space curve, in which the sensor unit is to be finally mounted. For fabrication of the sensor unit, the electrode strip is inserted in this two-dimensional bent carrier, as previously described, and embedded with the filler material. The two-dimensional prefabrication in particular has the advantage that the sensor unit during production, subsequent transport, and possible storage can be stored on flat surfaces and packed with the saving of space.

The sensor unit in this regard is designed flexible in such a way that during the final mounting (e.g., in a motor vehicle), it can be bent in its three-dimensional bent final mounting state. The two-dimensional fabricated sensor unit can be first bent immediately before or during the final mounting into the three-dimensional mounting state.

A flexible, flat conductor structure, especially a so-called flexible conductor, can be used as the electrode strip. In an embodiment, the electrode strip has a number of electrode layers with interposed insulating layers. In particular, the electrode strip has a number of electrode layers which are layered one above the other transverse to their layer plane. In this type of arrangement, the different layers are expediently provided for different purposes (transmitting electrode, receiving electrode, or shielding electrode) and accordingly wired with different potentials. In addition or alternatively, the electrode strip can contain a number of electrode layers parallel to the layer plane and arranged next to one another. In order to achieve better spatial sensor unit resolution, the electrode strip can be divided by a number of electrode layers, arranged side-by-side in the longitudinal direction of the sensor unit, into a number of segments with receiving electrodes independent of one another.

The electrode strip can be glued into the carrier. It is provided as an alternative thereto to imprint the electrode strip as an electrically conducting layer onto the carrier wall delimiting the interior space. By this means, complex electrode structures can be made in an especially simple manner and affixed precisely and fixedly on the carrier. Optionally multilayer electrode structures are created hereby by alternating imprinting of electrically conducting electrode layers and insulating layers.

The imprinting of the electrode strip in the interior space of the U-shaped carrier basically can be advantageous also without the subsequent filling of this interior space with the filler material. The imprinting of an electrode structure in the interior space of a U-shaped carrier for the production of a capacitive sensor unit is regarded as an independent invention in this respect, the carrier being produced particularly in one of the ways described hereinafter.

In an embodiment of the invention, the carrier is fabricated as an injection-molded plastic part. This advantageously enables particularly the relatively simple production of carriers with a complex shape, whose cross section deviates from a simple trough or channel shape. Mounting elements (for example, mounting clips or mounting pins) for attaching the sensor unit are expediently formed integrally during the production of the carrier. In addition or alternatively, such mounting elements are embedded, preferably form-fittingly, in the filler material.

In an especially cost-effective alternative of the production method, the carrier is made from a thermoformed plastic film, particularly from polyurethane.

In an embodiment, the capacitive sensor unit comprises a carrier with a U-shaped cross section, made of a water-impermeable material, an electrode strip, which lies within an interior space along the longitudinal extension of the carrier, and a filling made of a hardened filler material, which embeds the electrode strip watertight in the interior space of the carrier. The sensor unit is fabricated especially according to one of the above-described variants of the production method of the invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
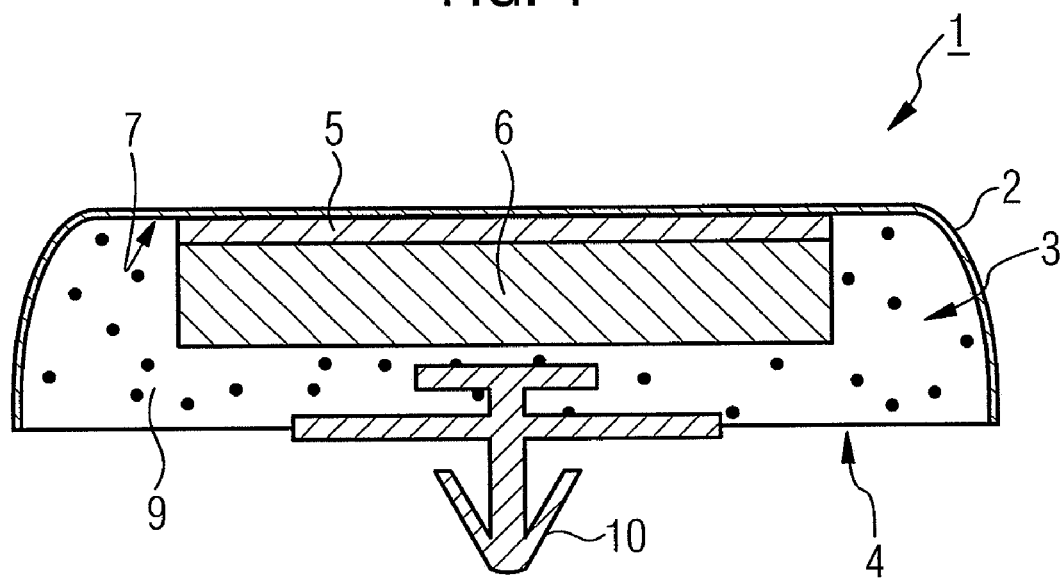
FIG. 1 shows a capacitive sensor unit in a schematic illustration.

FIG. 1 shows a cross section through a capacitive sensor unit 1. Sensor unit 1 comprises a longish carrier 2, whose longitudinal extension is oriented transverse to the plane of the drawing. Carrier 2 is approximately U-shaped in cross section, as a result of which it delimits an interior space 3 from three sides. The interior space 3 of carrier 2 is open outwardly on a fourth long side 4. Carrier 2 is closed by front walls on the longitudinal ends (not shown). Carrier 2 therefore has a trough-shaped form.

A likewise elongated electrode strip 6 is glued to a bottom area 7 of carrier 2 in interior space 3 by means of an adhesive layer 5. Electrode strip 6, whose longitudinal extension is oriented parallel to the longitudinal extension of carrier 2, is in turn formed by a number of electrode layers (in a manner that is not shown). These comprise, e.g., a transmitting electrode layer, a receiving electrode layer, and optionally a shielding electrode layer. The electrode layers are embedded in an insulating layer and thus insulated electrically from one another. Electrode strip 6 is a so-called flexible conductor.

The interior space 3 is largely filled by a filling 9, which surrounds electrode strip 6, as a result of which electrode strip 6 is protected from the entry of water and dirt.

Carrier 2 and/or filling 9, preferably both, have an electrically insulating material thereby permeable for electromagnetic radiation. Carrier 2 has a plastic film made of polyurethane with a wall thickness of preferably about 1 mm.

Filling 9 includes a filler material that is viscous in the unprocessed state and is made of a polyurethane casting resin, which hardens in air into a flexible, cohesive body.

To produce sensor unit 1, carrier 2 is first produced by thermoforming. The finished carrier 2, just as its longitudinal axis, runs along a two-dimensional curved path. Carrier 2 therefore forms a structure lying substantially in a flat plane, which corresponds, e.g., approximately to the projection of a predefined three-dimensional curved installation position of sensor unit 1 in this plane. Electrode strip 6, obtained as a finished part and at the end sides already contacting electric connecting lines, is glued into the thus fabricated carrier 2. Next, interior space 3 is cast with the embedding of electrode strip 6 with the still liquid filler material. In so doing, optionally mounting clips 10 for attaching sensor unit 1 form-fittingly with a fixed end are cast integrally.

After the filler material hardens, carrier 2 with electrode strip 6 and filling 9, as well as the optionally cast mounting clips 10, forms a form-fitting cohesive and watertight encapsulated structural unit, which is elastically bendable and twistable to a certain extent, so that sensor unit 1 can be fitted to the three-dimensional curved installation position.

Figure 2:
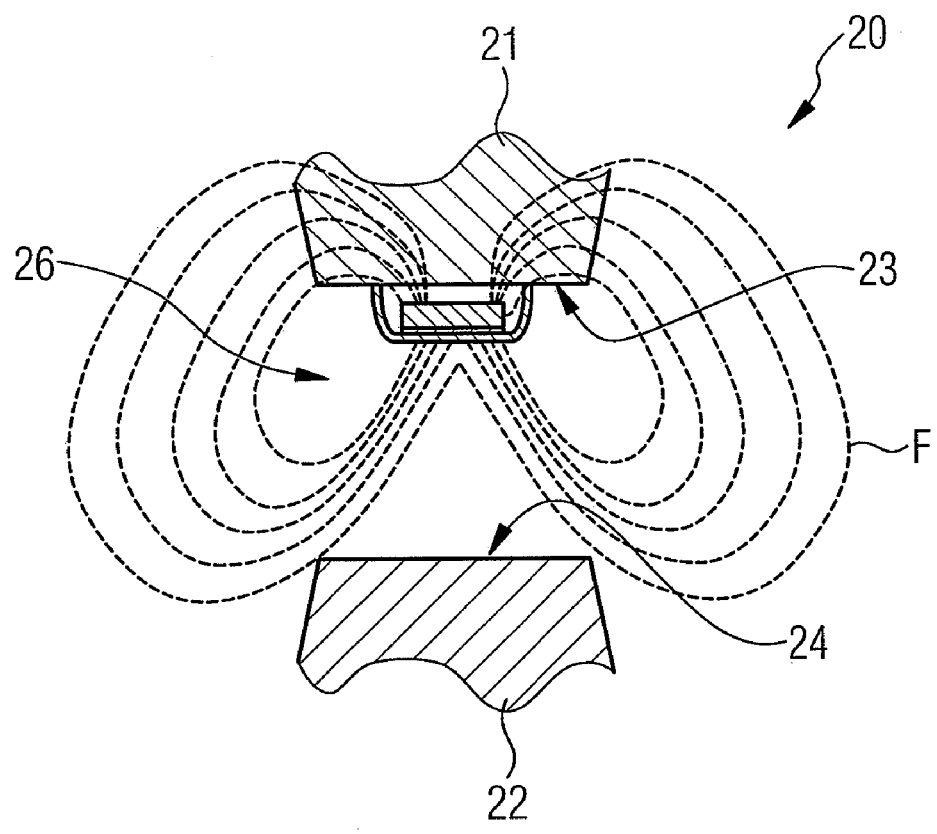
FIG. 2 shows the sensor unit in the illustration according to FIG. 1 in a final mounting state in a motor vehicle.

The edge region of a motor-driven operable trunk lid 21 and a detail of a rigid wall 22 of a trunk compartment are shown in FIG. 2 in a detail-like cross section through a motor vehicle 20. Sensor unit 1 as part of a capacitive, contact-free anti-pinch device is placed along a closing edge 23 of trunk lid 21. To this end, it is bent into the three-dimensional curved shape of closing edge 23 and affixed with mounting clips 10 in the corresponding retainers in trunk lid 21. Sensor unit 1 is preferably glued in addition to trunk lid 21.

In the final mounting state according to FIG. 2, sensor unit 1 is therefore arranged in the immediate vicinity of a pinch region 26, which is formed between closing edge 23 and a corresponding opposite closing edge 24 of wall 22.

An electric field F radiated into pinch region 26 during the operation of sensor unit 1 according to the intended use for the detection of a case of pinching is indicated furthermore in FIG. 2.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for manufacturing a capacitive sensor unit, the method comprising:
   providing an elongated trough shaped carrier, open at the top, that is approximately U-shaped in cross section, the elongated carrier being made of a water-impermeable material;
   placing at least one electrode strip in an interior space of the carrier along a longitudinal extension of the carrier; and
   filling the interior space with a hardening filler material such that the electrode strip, after hardening of the filler material, is sealed outwardly watertight.

2. The method according to claim 1, wherein the carrier and the hardened filler material together with the electrode strip embedded in-between form a form-fittingly connected, bendable structural unit.

3. The method according to claim 2, wherein the sensor unit is first fabricated in a two-dimensional curved tubular form, which is bent into a three-dimensional shape during the final mounting.

4. The method according to claim 1, wherein the electrode strip is glued into the carrier.

5. The method according to claim 1, wherein the electrode strip is imprinted in the carrier.

6. The method according to claim 1, wherein the electrode strip comprises a number of electrode layers, each with an interposed insulating layer.

7. The method according to claim 1, wherein the carrier is fabricated as an injection-molded plastic part.

8. The method according to claim 1, wherein the carrier is made from a thermoformed plastic film.

9. The method according to claim 1, wherein the filler material is a closed-pore foam, an adhesive, or a casting resin.

10. The method according to claim 1, wherein mounting elements are embedded form-fittingly in the filler material.

11. A capacitive sensor unit comprising:
    an elongated trough shaped carrier, open at the top, that is approximately U-shaped in cross section and made of a water-impermeable material;
    an electrode strip arranged within an interior space of the carrier along a longitudinal extension of the carrier; and
    a filling of a hardening filler material, which in a hardened state embeds the electrode strip watertight.

12. The method according to claim 1, wherein the sensor unit is a sensor unit of an anti-pinching device for or in a motor vehicle.

\* \* \* \* \*